United States Patent [19]
Lee et al.

[11] Patent Number: 6,131,269
[45] Date of Patent: Oct. 17, 2000

[54] CIRCUIT ISOLATION TECHNIQUE FOR RF AND MILLIMETER-WAVE MODULES

[75] Inventors: Alfred E. Lee, Torrance; Steven S. Chan, Alhambra, both of Calif.

[73] Assignee: TRW Inc., Redondo Beach, Calif.

[21] Appl. No.: 09/080,423

[22] Filed: May 18, 1998

[51] Int. Cl.$^7$ ............................................. H01P 11/00
[52] U.S. Cl. ................................ 29/600; 333/1; 333/12; 333/246
[58] Field of Search ................................ 333/1, 12, 238, 333/246, 247; 29/600

[56] References Cited

U.S. PATENT DOCUMENTS

| | | | |
|---|---|---|---|
| 4,513,266 | 4/1985 | Ishihara | 333/238 |
| 4,870,377 | 9/1989 | Brown et al. | 333/238 |
| 5,227,749 | 7/1993 | Raguenet et al. | 333/246 |
| 5,426,399 | 6/1995 | Matsubayashi et al. | 333/1 |
| 5,777,526 | 7/1998 | Kawasaki | 333/238 X |
| 5,907,477 | 5/1999 | Tuttle et al. | 343/702 X |

FOREIGN PATENT DOCUMENTS 226801  9/1990  Japan ..................................... 333/246

*Primary Examiner*—Benny Lee
*Attorney, Agent, or Firm*—Michael S. Yatsko

[57] ABSTRACT

A circuit module construction and method for its fabrication, in which radio-frequency (RF) or millimeter-wave circuit components (10) are electromagnetically isolated in a circuit module (12), to allow for location of multiple circuit components in close proximity without concern for signal loss or interference between components. Multiple RF or millimeter-wave circuit components (10) are installed on a dielectric substrate (14) and are separated by at least one metal isolation wall (20), which extends in depth all the way through the dielectric substrate (14) to a metal layer (16) formed under the substrate. Each isolation wall (20) is formed by first cutting a channel through the dielectric substrate (14), preferably using a laser that selectively removes the dielectric material but not the metal layer (16). Then the channel is filled with metal by electroplating, to provide continuous electromagnetic isolation in a lateral direction, parallel to the plane of the substrate (14).

3 Claims, 2 Drawing Sheets

---

FORMING A CHANNEL IN A DIELECTRIC SUBSTRATE, USING A LASER BEAM THAT SELECTIVELY REMOVES DIELECTRIC MATERIAL BUT NOT METAL IN A METAL LAYER ON THE UNDERSIDE OF THE SUBSTRATE

FILLING THE CHANNEL WITH METAL BY ELECTROPLATING THE CHANNEL, TO PROVIDE AN ISOLATION WALL BETWEEN CIRCUIT COMPONENTS POSITIONED IN CLOSE PROXIMITY TO EACH OTHER

CIRCUIT ISOLATION TECHNIQUE FOR RF AND MILLIMETER-WAVE MODULES

BACKGROUND OF THE INVENTION

This invention relates generally to integration and packaging of radio-frequency (RF) and millimeter-wave circuit components and, more particularly, to techniques for electrically isolating RF and millimeter-wave components, to maintain circuit performance. The difficulty designers face in this area is that parallel RF paths less than & substrate width apart have reduced RF signal transfer efficiency because RF energy is lost through coupling to the adjoining RF path. The invention is concerned with providing electrical or electromagnetic isolation in a lateral direction, that is, in directions parallel to the plane of the substrate. Isolation in a direction perpendicular to the substrate is provided conventionally by the metal backplane on one face of the substrate, and by a layer of metalization on the upper surface. To solve the isolation problem, module designers may separate the circuit components by many substrate widths, but this approach greatly increases module size and weight. Another approach is to compartmentalize each module by machining cavities in it to separate the components. Again, this approach adds complexity and cost to the module.

Yet another approach is to form via holes through the RF module, and to electroplate the holes to form a piece-wise ground plane that reduces inter-component coupling. The large number of holes required for this approach greatly reduces the module's mechanical integrity, because of the substrate material between holes tends to crack if the hole spacing is too small. The use of via holes also limits the possibilities for integration into other RF systems. Further, the presence of multiple via holes does not provide complete isolation, especially for higher signal frequencies. As a rule of thumb, the via holes must be spaced by closer than a quarter wavelength to provide effective isolation. Even when this closely spaced, the via holes do not provide a barrier to isolation for second and higher harmonics of the RF signals. Some designs have used multiple lines of via holes to provide additional isolation, but this technique takes even more space on the module and further weakens the substrate material. In addition, none of the foregoing approaches results in a compact module, contrary to the desirable goal of reducing the size and weight of the module.

It will be appreciated from the foregoing that there is still a need for a new approach to provide lateral electrical isolation of RF and millimeter-wave circuit components mounted close together on a substrate. The present invention satisfies this need.

SUMMARY OF THE INVENTION

The present invention resides in a circuit module construction, and a corresponding method for its fabrication, in which a continuous metal isolation wall is formed between circuit modules to greatly increase lateral electrical isolation of closely adjacent RF or millimeter-wave circuit components mounted on a single substrate. Briefly, and in general terms, the circuit module construction of the invention comprises a dielectric substrate having a metal layer its underside; a plurality of RF or millimeter-wave circuit components mounted on or embedded in the dielectric substrate; and at least one metal isolation wall formed in the substrate, perpendicular to and adjoining the metal layer, and separating adjacent RF or millimeter-wave circuit components to provide electromagnetic isolation of the circuit components in a lateral direction. Because of the presence of the isolation wall, the circuit components may be positioned in close proximity without significant interference or signal loss between them.

The invention may also be defined in terms of a method for forming at least one isolation wall between adjacent radio-frequency (RF) or millimeter-wave circuit components installed on a circuit a module having a dielectric substrate with a metal layer on its underside, the method comprising the steps of forming at least one channel in the dielectric substrate, to define at least one isolation wall separating adjacent circuit components installed on the substrate, wherein the at least one channel extends all the way through the dielectric substrate but not through the metal layer; and filling the at least one channel with a conductive material, such as a metal, to provide an isolation wall between circuit components. The circuit components may then be positioned in close proximity without significant interference or signal loss between the components.

Ideally, the forming step is performed with a laser beam that selectively removes the dielectric material but not the metal in the metal layer. The filling step is effected by electroplating.

It will be appreciated from the foregoing that the present invention represents a significant advance in the field of RF and millimeter-wave circuit design and packaging. In particular, the invention allows RF circuit components to be positioned in very close proximity because the continuous isolation wall of the invention provides a very high level of electromagnetic isolation of the components separated by the wall. As a result, RF circuit components may be packed more densely in a circuit module without concern for significant signal loss or signal interference. Other aspects and advantages of the invention will become apparent from the following more detailed description, taken in conjunction with the accompanying drawings.

DESCRIPTION OF THE PREFERRED EMBODIMENT

Figure 1:
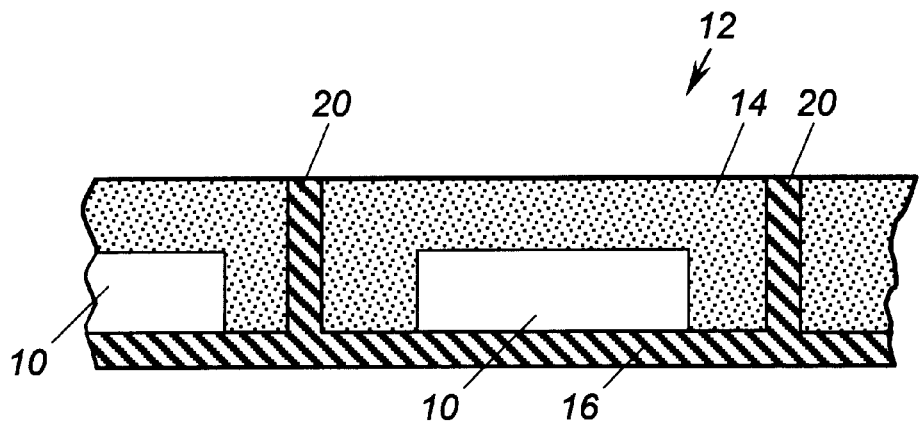
FIG. 1 is a simplified fragmentary cross-sectional view of an RF or millimeter-wave circuit module containing multiple circuit components that require electrical isolation.
Figure 2:
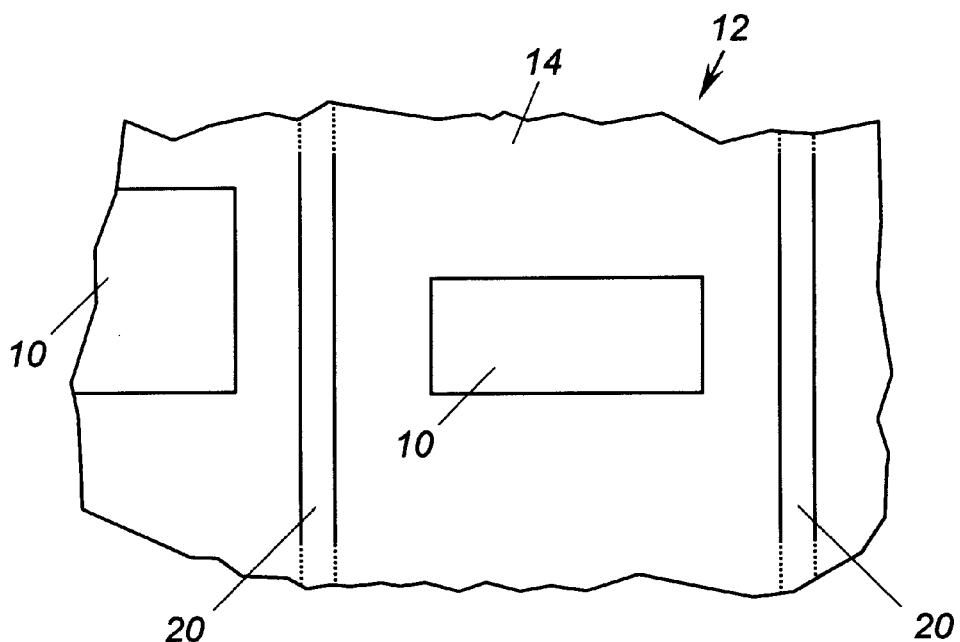
FIG. 2 is an illustrative plan view of a circuit module similar to the one shown in FIG. 1 and showing multiple isolation walls in accordance with the invention.

As shown in FIGS. 1 and 2 of the drawings for purposes of illustration, the present invention pertains to techniques for electrically isolating multiple radio-frequency (RF) and millimeter-wave circuit components, indicated by reference numeral 10, mounted on a single circuit module 12. Basically, the circuit module 12 includes a dielectric substrate 14 of ceramic, polymeric or other material, and an underlying metal base 16 (see FIG. 1), which provides isolation in one direction only. A metalization layer (not shown) is typically employed to provide isolation in the opposite direction. Isolation in all other directions, parallel to the substrate plane, is the goal of the goal of the present invention. In the past, various techniques have been used, such as compartmentalization of the circuit components, increasing the inter-components spacing, or forming large numbers of metalized via holes through the dielectric substrate 14.

In accordance with the present invention, isolation walls 20 are formed between the circuit components 10 to be laterally isolated. The isolation walls are of solid metal and extend completely through the thickness of the dielectric substrate 14. The walls 20 provide maximum lateral isolation of the components 10, and yet do not weaken the integrity of the substrate 14. On the contrary, the substrate 14 is, in most cases, strengthened by the presence of the solid isolation walls 20.

Figure 3:
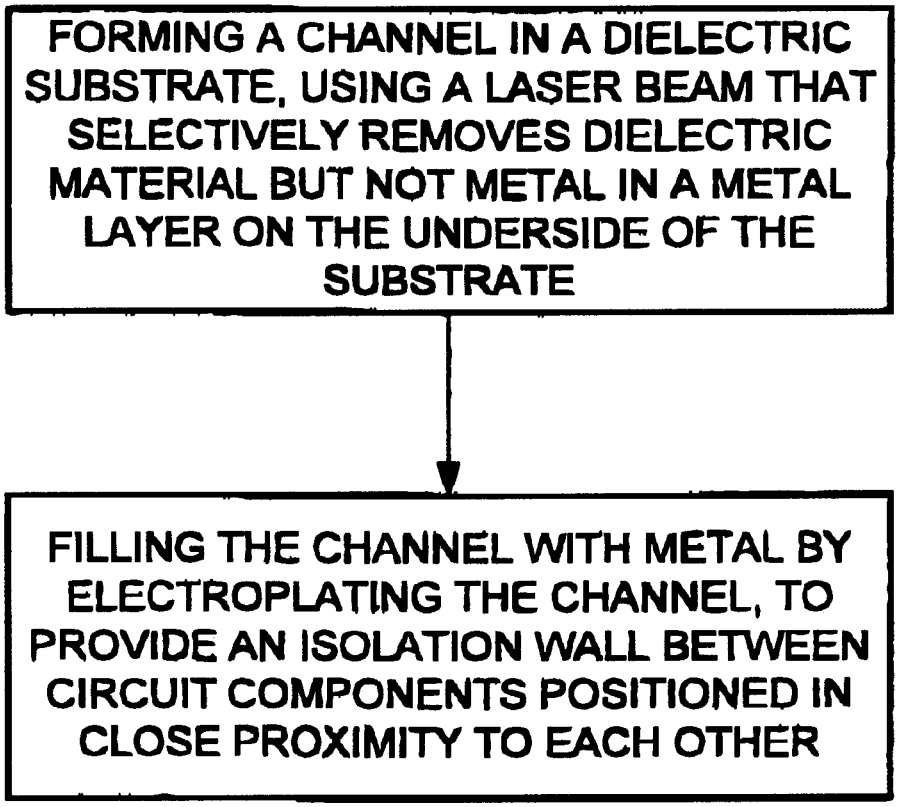
FIG. 3 is a flowchart showing the method steps of the invention.

The isolation walls 20 are conveniently formed, as indicated in the first block of FIG. 3, by first making corresponding channels in the substrate 14 using a cutting laser, such as a carbon dioxide or other laser of appropriate power for the material being cut. The laser is chosen to provide selectivity in the material it will cut, such that the polymeric material of the substrate 14 will be removed much more readily than the metal base 16. Therefore, the channels can be formed easily without removal of any significant amount of material from the metal base 16. After the channels have been formed, they are filled with metal using a conventional electroplating process, as indicated in the second block of FIG. 3, either before or during the process of forming an upper metalization layer.

It will be appreciated from the foregoing that the present invention represents a significant advance in the field of RF and millimeter-wave circuit component packaging. In particular, the invention provides a technique for ensuring lateral isolation of RF and millimeter-wave circuit components, which may be mounted close together on a single circuit module. The technique of the invention achieves practically complete isolation in a lateral direction, without affecting the integrity of the substrate on which the circuit components are mounted. It will also be appreciated that, although the invention has been described in detail for purposes of illustration, various modifications may be made without departing from the spirit and scope of the invention, which should not be limited except as by the appended claims.

What is claimed is:

1. A method for forming at least one continuous isolation wall between adjacent radio-frequency (RF) or millimeter-wave circuit components embedded in a circuit module having a dielectric substrate having a thickness and with a metal layer disposed on an underside thereof, the method comprising the steps of:

forming at least one channel in the dielectric substrate, the at least one channel is thin in relation to the thickness of the substrate and wherein the at least one channel extends all the way through the dielectric substrate without adversely affecting the structural integrity thereof, but not through the metal layer; and filling the at least one channel with metal to provide at least one continuous isolation wall separating adjacent ones of said circuit components installed on the substrate, wherein the ones of said circuit components are positioned in close proximity without significant interference or signal loss between the components.

2. A method as defined in claim 1, wherein the filling step is effected by electroplating the at least one channel.

3. A method as defined in claim 2, wherein the forming step is performed with a laser beam that selectively removes the dielectric material but not the metal in the metal layer.

* * * * *